(12) United States Patent
Sasaki (10) Patent No.: US 10,257,920 B2
(45) Date of Patent: Apr. 9, 2019

(54) SEMICONDUCTOR DEVICE

(71) Applicant: SHINDENGEN ELECTRIC MANUFACTURING CO., LTD., Tokyo (JP)

(72) Inventor: Mitsumasa Sasaki, Hanno (JP)

(73) Assignee: Shindengen Electric Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 15/574,834

(22) PCT Filed: May 29, 2015

(86) PCT No.: PCT/JP2015/065571
§ 371 (c)(1),
(2) Date: Nov. 16, 2017

(87) PCT Pub. No.: WO2016/194046
PCT Pub. Date: Dec. 8, 2016

(65) Prior Publication Data
US 2018/0153032 A1 May 31, 2018

(51) Int. Cl.
*H05K 1/02* (2006.01)
*H05K 1/18* (2006.01)
*H02K 11/00* (2016.01)
*H02K 11/33* (2016.01)
(Continued)

(52) U.S. Cl.
CPC ........... *H05K 1/0224* (2013.01); *H02K 11/00* (2013.01); *H02K 11/33* (2016.01); *H02P 25/16* (2013.01);
(Continued)

(58) Field of Classification Search
CPC .................................................. H05K 1/0224
(Continued)

(56) References Cited

U.S. PATENT DOCUMENTS 8,102,145 B2 * 1/2012 Merrill .................. H02J 7/1453
320/104
8,559,197 B2 * 10/2013 Cullinane ................ H02P 9/02
363/37
(Continued)

FOREIGN PATENT DOCUMENTS

JP 2000-262014 A 9/2000
JP 2002-184940 A 6/2002
(Continued)

OTHER PUBLICATIONS

Notification of Transmittal of the ISR and Written Opinion of the ISA relating to International Application No. PCT/JP2015/065571, dated Aug. 25, 2015.
(Continued)

*Primary Examiner* — David Luo
(74) *Attorney, Agent, or Firm* — The Harris Firm (57) ABSTRACT

A semiconductor device includes: an annular or partially annular substrate; a first control circuit provided on the substrate and configured to control a first phase of a motor; a second control circuit provided on the substrate so as to be adjacent to the first control circuit in a circumferential direction of the substrate and configured to control a second phase of the motor; a power supply wiring disposed on one of outer and inner circumferential sides of the first and second control circuits in a radial direction of the substrate, the power supply wiring being connected to the first and second control circuits, and extending in the circumferential direction; and a ground winding disposed on another one of the outer and inner circumferential sides of the first and second control circuits in the radial direction, being connected to the first and second control circuits, and extending in the circumferential direction.

7 Claims, 10 Drawing Sheets

(51) Int. Cl.
*H02P 25/16* (2006.01)
*H05K 5/00* (2006.01)

(52) U.S. Cl.
CPC .......... *H05K 1/0203* (2013.01); *H05K 1/181* (2013.01); *H05K 5/0008* (2013.01); *H05K 5/0026* (2013.01); *H05K 2201/093* (2013.01); *H05K 2201/09027* (2013.01); *H05K 2201/09063* (2013.01); *H05K 2201/09345* (2013.01); *H05K 2201/09354* (2013.01); *H05K 2201/1009* (2013.01); *H05K 2201/1034* (2013.01); *H05K 2201/10166* (2013.01); *H05K 2201/10287* (2013.01); *H05K 2201/10522* (2013.01)

(58) Field of Classification Search
USPC .......................................... 318/400.3, 400.01
See application file for complete search history.

(56) References Cited

U.S. PATENT DOCUMENTS

| 2003/0173839 A1 | 9/2003 | Torii et al. |
| 2006/0002054 A1 | 1/2006 | Anwar et al. |

FOREIGN PATENT DOCUMENTS

| JP | 2004-039749 A | 2/2004 |
| JP | 2004-040877 A | 2/2004 |
| JP | 2004-208467 A | 7/2004 |

OTHER PUBLICATIONS

International Search Report (ISR) relating to International Application No. PCT/JP2015/065571, dated Aug. 25, 2015.
Written Opinion of the ISA relating to International Application No. PCT/JP2015/065571, dated Aug. 25, 2015.
Response to ISA Written Opinion, dated Sep. 25, 2015.
Amendment filed in International Application No. PCT/JP2015/065571 under PCT Article 34, dated Sep. 25, 2015.
IPEA Receipt of the Demand for International Preliminary Examination of the International Application No. PCT/2015/065571, dated Oct. 20, 2015.
Written Opinion of the IPEA relating to International Application No. PCT/JP2015/065571, dated Dec. 28, 2015.
Response to IPEA Written Opinion, dated Jan. 19, 2016.
Amendment filed in International Application No. PCT/JP2015/065571 under PCT Article 34, dated Jan. 19, 2017.
Notification of Transmittal of International Preliminary Report on Patentability relating to International Application No. PCT/JP2015/065571, dated May 31, 2016.
International Preliminary Report on Patentability relating to International Application No. PCT/JP2015/065571, dated May 31, 2016.
International Preliminary Report on Patentability relating to International Application No. PCT/JP2015/065571, dated Apr. 21, 2016.
European Patent Office, Extended European Search Report relating to EP 15894081.7, dated Feb. 11, 2019.

* cited by examiner

SEMICONDUCTOR DEVICE

CROSS REFERENCE TO PRIOR APPLICATION(S)

This application is a U.S. National Stage Patent Application of PCT International Patent Application Ser. No. PCT/JP2015/065571 (filed on May 29, 2015) under 35 U.S.C. § 371, which is hereby incorporated by reference herein in its entirety.

TECHNICAL FIELD

The present invention relates to a semiconductor device.

BACKGROUND ART

Conventionally, semiconductor devices including a plurality of modules are known. For example, Patent Document 1 discloses a power semiconductor device including a plurality of modules connected by metal connecting plates.

CITATION LIST

[Patent Document]
 [Patent Document 1] Japanese Patent Application Laid-Open Publication No. 2002-184940

SUMMARY OF THE INVENTION

Problems to be Solved by the Invention

In the power semiconductor device described in Patent Document 1, since each module has power supply wirings and ground wirings, some wirings are long or complex. In this case, the technology disclosed in Patent Document 1 has a possibility that it might become susceptible to inductance caused by power supply current.

The present invention has been made in view of the above circumstances, and an object thereof is to provide a semiconductor device less susceptible to the inductance caused by the power supply current.

Means for Solving the Problems

A semiconductor device according to one aspect of the present invention includes: a substrate that is annular or partially annular, the substrate having an inner circumferential portion formed arcuate in plan view and an outer circumferential portion formed arcuate in plan view; a first phase control circuit provided on the substrate, the first phase control circuit being configured to control a first phase of a plurality of phases of a motor; a second phase control circuit provided on the substrate so as to be adjacent to the first phase control circuit in a circumferential direction of the substrate, the second phase control circuit being configured to control a second phase of the plurality of phases of the motor, the second phase being different from the first phase; a power supply wiring disposed on one of an outer circumferential side and an inner circumferential side of the first phase control circuit and the second phase control circuit in a radial direction of the substrate, the power supply wiring being connected to the first phase control circuit and the second phase control circuit, and the power supply wiring extending in the circumferential direction of the substrate; and a ground winding disposed on an other one of the outer circumferential side and the inner circumferential side of the first phase control circuit and the second phase control circuit in the radial direction of the substrate, the ground winding being connected to the first phase control circuit and the second phase control circuit, and the ground winding extending in the circumferential direction of the substrate.

Effects of the Invention

According to the present invention, the power supply wirings or the ground wirings are disposed on the inner circumferential side of the substrate, thereby making semiconductor device less susceptible to the inductance caused by the power supply current.

MODE FOR CARRYING OUT THE INVENTION

First Embodiment

A first embodiment of the present invention will be described.

Figure 1:
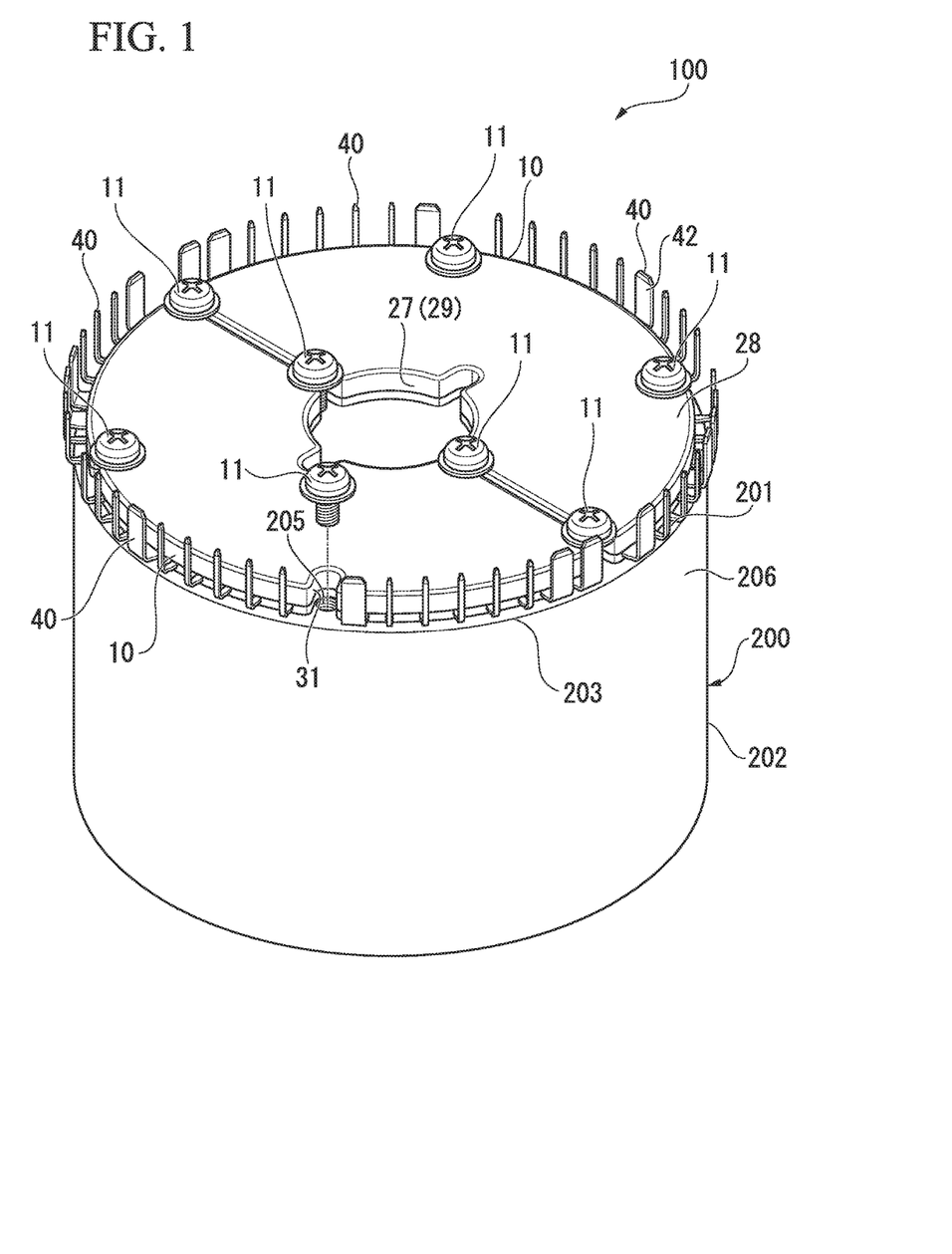
FIG. 1 is an external perspective view showing a state where a semiconductor device according to a first embodiment of the present invention has been mounted onto a motor.

As shown in FIG. 1, a semiconductor device 100 of the present embodiment is a control device for controlling an apparatus to be controlled. An object to be controlled by the semiconductor device 100 of the present embodiment is not particularly limited. As an example, the semiconductor device 100 of the present embodiment controls operation of a three-phase motor (hereinafter, simply referred to as "motor.") 200.

The semiconductor device 100 of the present embodiment is mountable on a predetermined mounting surface 201 provided on a motor 200 to be controlled. A shape of the mounting surface 201 is occasionally restricted depending on, for example, a structure of the motor 200. For example, the mounting surface 201 is provided on an outer surface of a case 202 for housing a coil and the like of the motor 200, which is one end face 203 of both end faces, in an extending direction (vertical direction in FIG. 1), of a rotation axis (not shown) of the motor 200. The mounting surface 201 is a plane orthogonal to the rotation axis of the motor 200.

Additionally, the case 202 of the motor 200 illustrated in the present embodiment is in substantially a cylindrical shape. Further, in some cases, the case 202 of the motor 200 is provided with a protruding portion 204 (see FIG. 3) which protrudes outward from the case 202 to hold the rotation axis of the motor 200, on one or both ends, in the extending direction, of the rotation axis of the motor 200. The mounting surface 201 of the present embodiment has a circular annular shape surrounding an outer circumference of the protruding portion 204 formed on the case 202. In other words, the mounting surface 201 of the motor 200 to be fixed with the semiconductor device 100 of the present embodiment has a circular annular shape when viewed from the extending direction of the rotation axis of the motor 200. Here, in this specification, a view seen from the extending direction of the rotation shaft of the motor 200 is defined as a plan view. Additionally, the detailed shape of the mounting surface 201 is not limited to the shape described above.

Further, the mounting surface 201 provided on the motor 200 is provided with a plurality of screw holes 205 to be screwed with screws 11 for fixing, by screwing, the semiconductor device 100.

Next, a configuration of the semiconductor device 100 of the present embodiment will be described.

Figure 2:
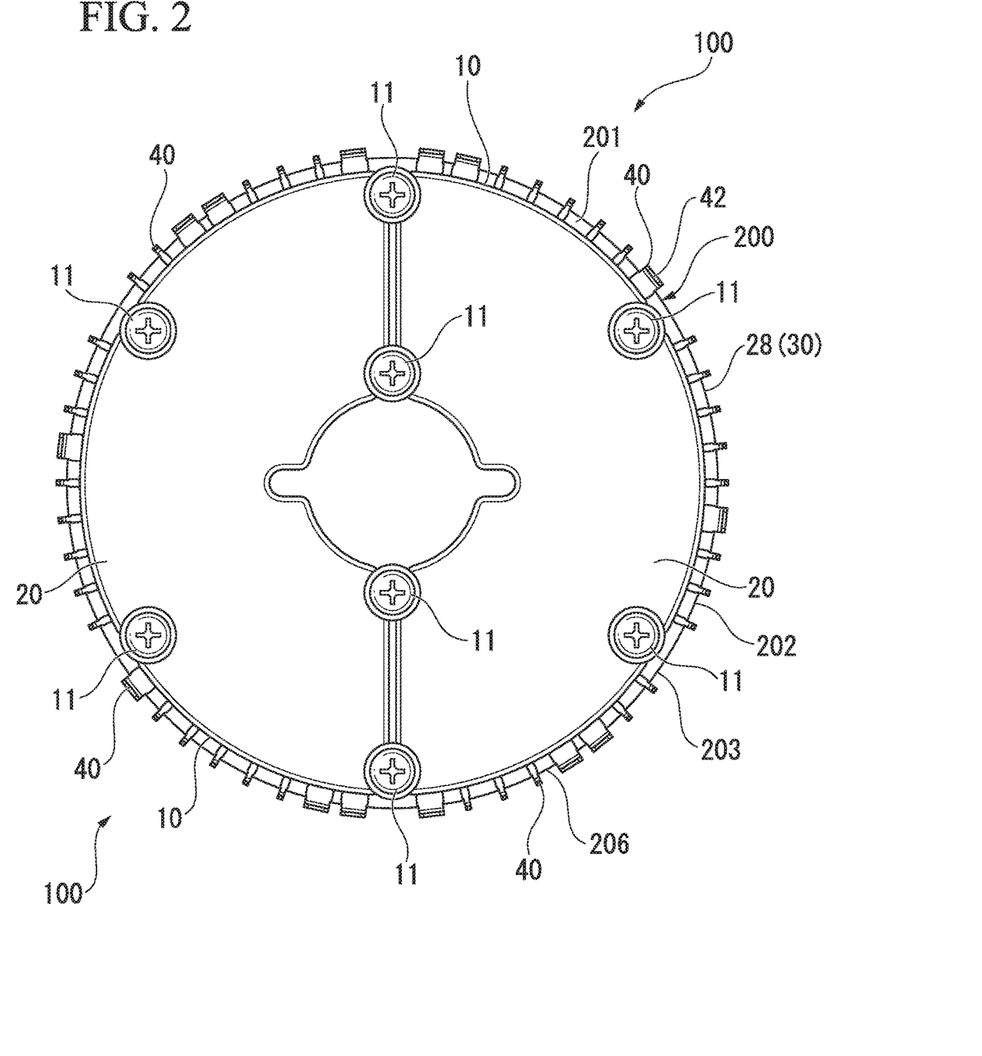
FIG. 2 is a plan view showing the state where the semiconductor device has been mounted on a motor.
Figure 3:
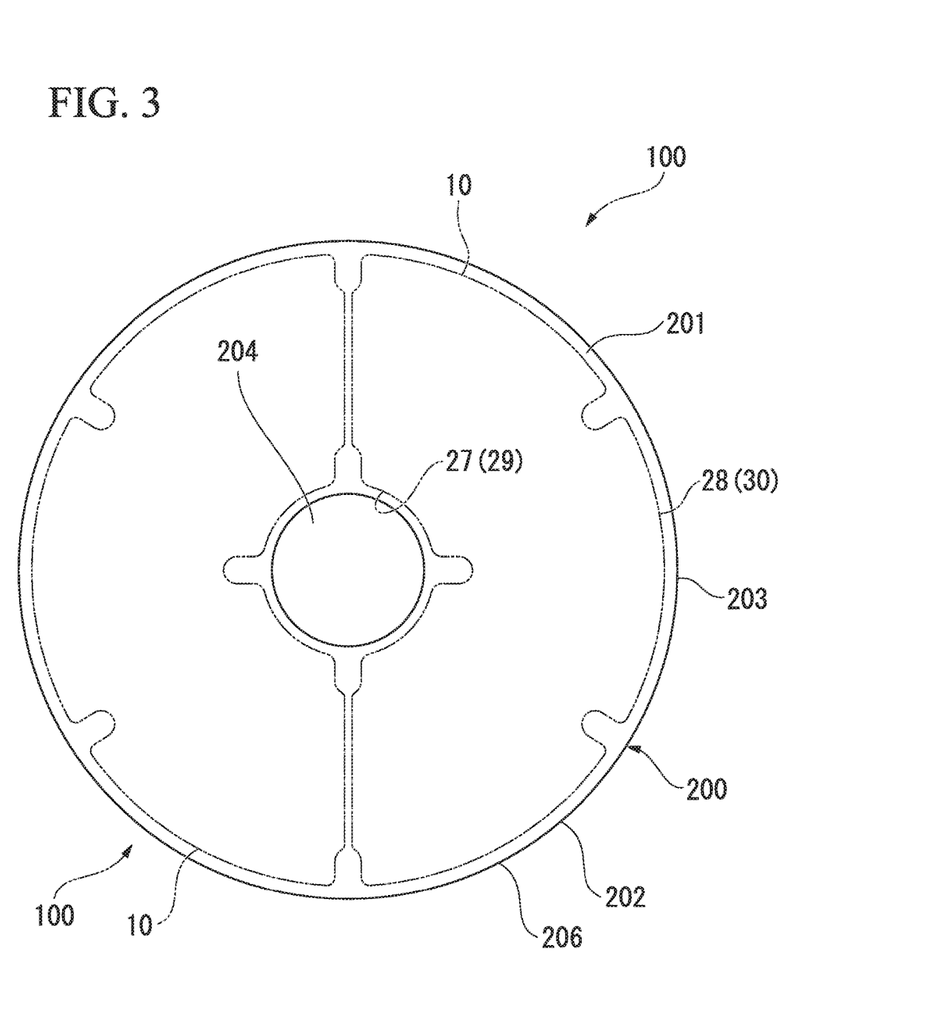
FIG. 3 is a schematic plan view showing an example of a mounting surface of the motor to be mounted with the semiconductor device.
Figure 6:
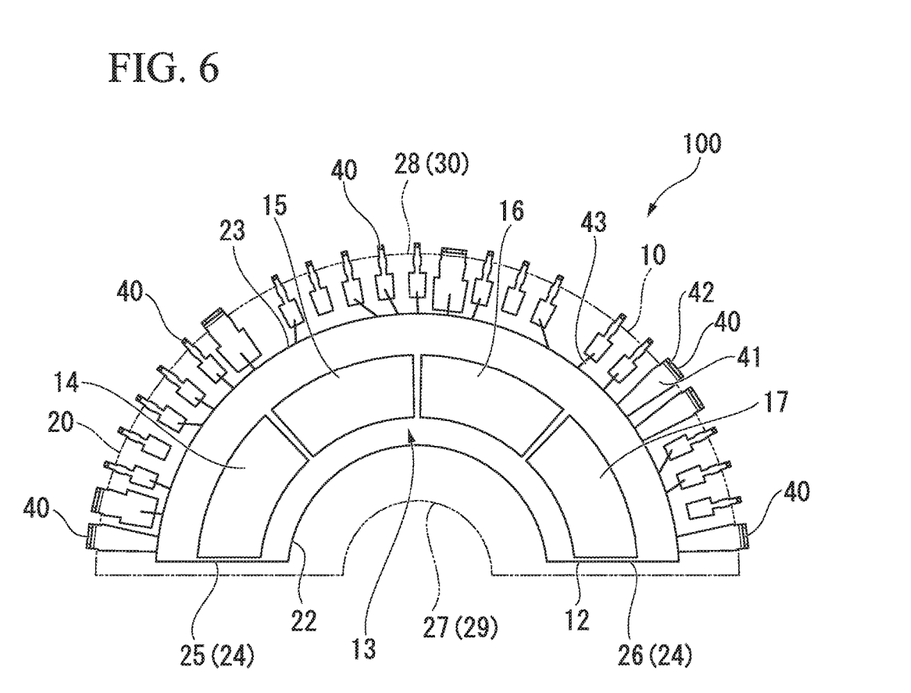
FIG. 6 is a view showing an internal structure of the semiconductor device.

As shown in FIGS. 2, 3, and 6, the semiconductor device 100 includes a device main body 10 and leads 40.

The device main body 10 includes a substrate 12, a phase control circuit 13, a relay circuit 17, a power supply winding 18 (see FIG. 7), a ground wiring 19 (see FIG. 7), and a sealing resin 20. Here, the device main body 10 need not include the relay circuit 17.

Figure 4:
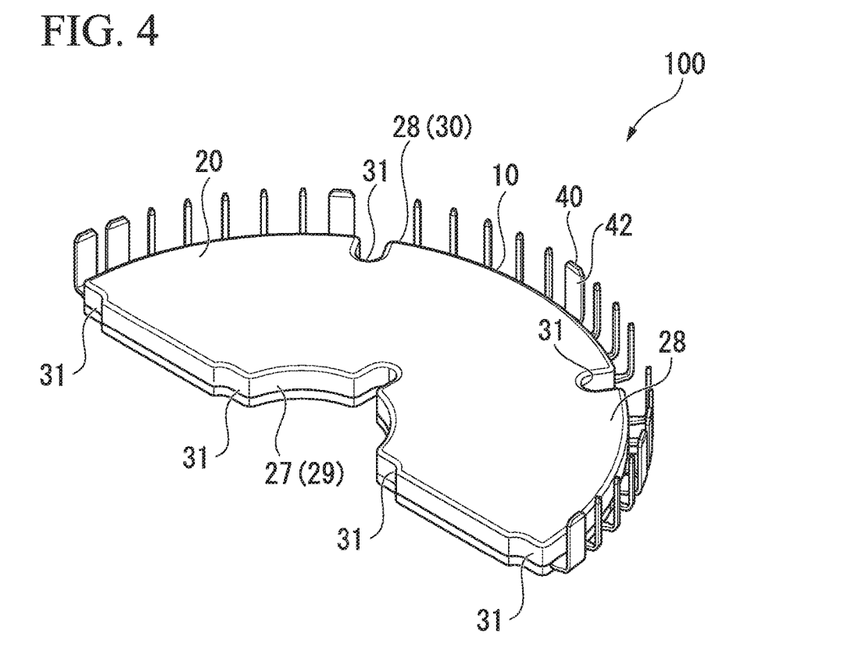
FIG. 4 is an external perspective view, seen obliquely from above, of the semiconductor device.
Figure 5:
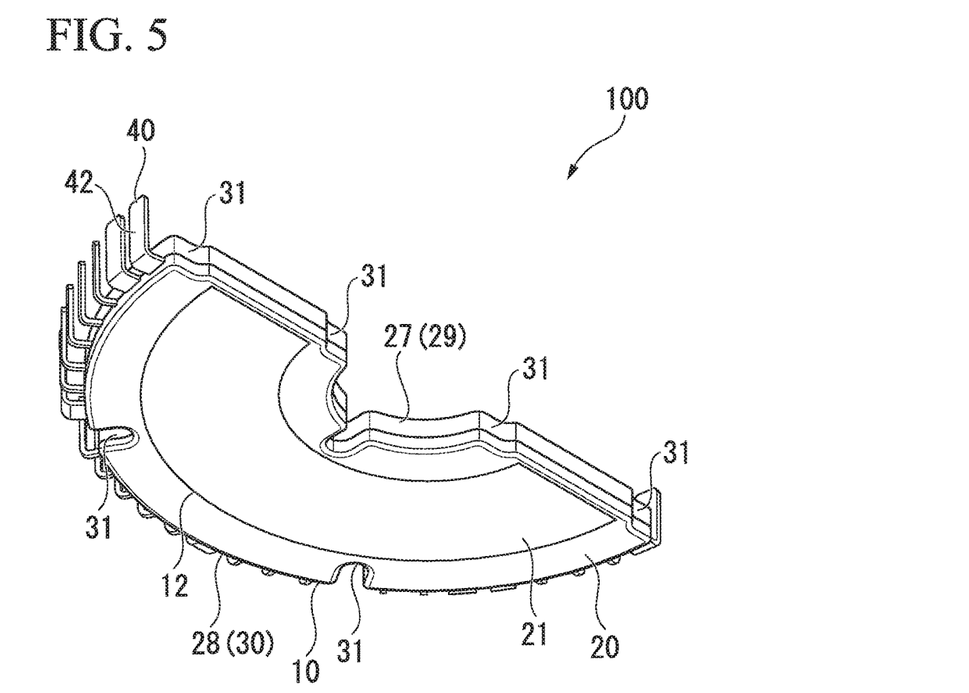
FIG. 5 is an external perspective view, seen obliquely from below, of the semiconductor device.

As shown in FIGS. 4 to 6, the substrate 12 is an insulating substrate (e.g., DCB substrate) with a heat dissipating function, which is formed by joining a ceramic plate and a circuit board 21 made of metal with high heat conductivity, such as copper or aluminum.

The substrate 12 has: an inner circumferential portion 22 and an outer circumferential portion 23 which are formed concentric and circular arcuate to each other in plan view; and end portions 24 in a circumferential direction of the substrate 12 (first end portion 25, second end portion 26). The substrate 12 is formed semicircular annular (partially-circular annular, semicircular annular) in plan view.

The inner circumferential portion 22 of the substrate 12 is formed in a circular arcuate shape so as to surround the protruding portion 204 formed on the motor 200, in the mounted state where the semiconductor device 100 has been mounted on the mounting surface 201 of the motor 200. A diameter dimension of the inner circumferential portion 22 of the substrate 12 is greater than, for example, an outer diameter dimension of the projecting portion 204.

The outer circumferential portion 23 of the substrate 12 is formed smaller in outer diameter dimension than an outer circumferential surface 206 of the case 202 of the motor 200 (see FIG. 1), in the mounted state where the semiconductor device 100 has been mounted on the mounting surface 201 of the motor 200.

A circuit board 21 provided on the substrate 12 is exposed to the outside of the sealing resin 20 in a state where the substrate 12 is sealed with the sealing resin 20 which will be described later. The circuit board 21 contacts the mounting surface 201 of the motor 200 in the state where the semiconductor device 100 has been mounted on the mounting surface 201 of the motor 200. By the circuit board 21 contacting the mounting surface 201 of the motor 200, for example, it is possible to release heat generated in the semiconductor device 100 to the case 202 of the motor 200.

Figure 7:
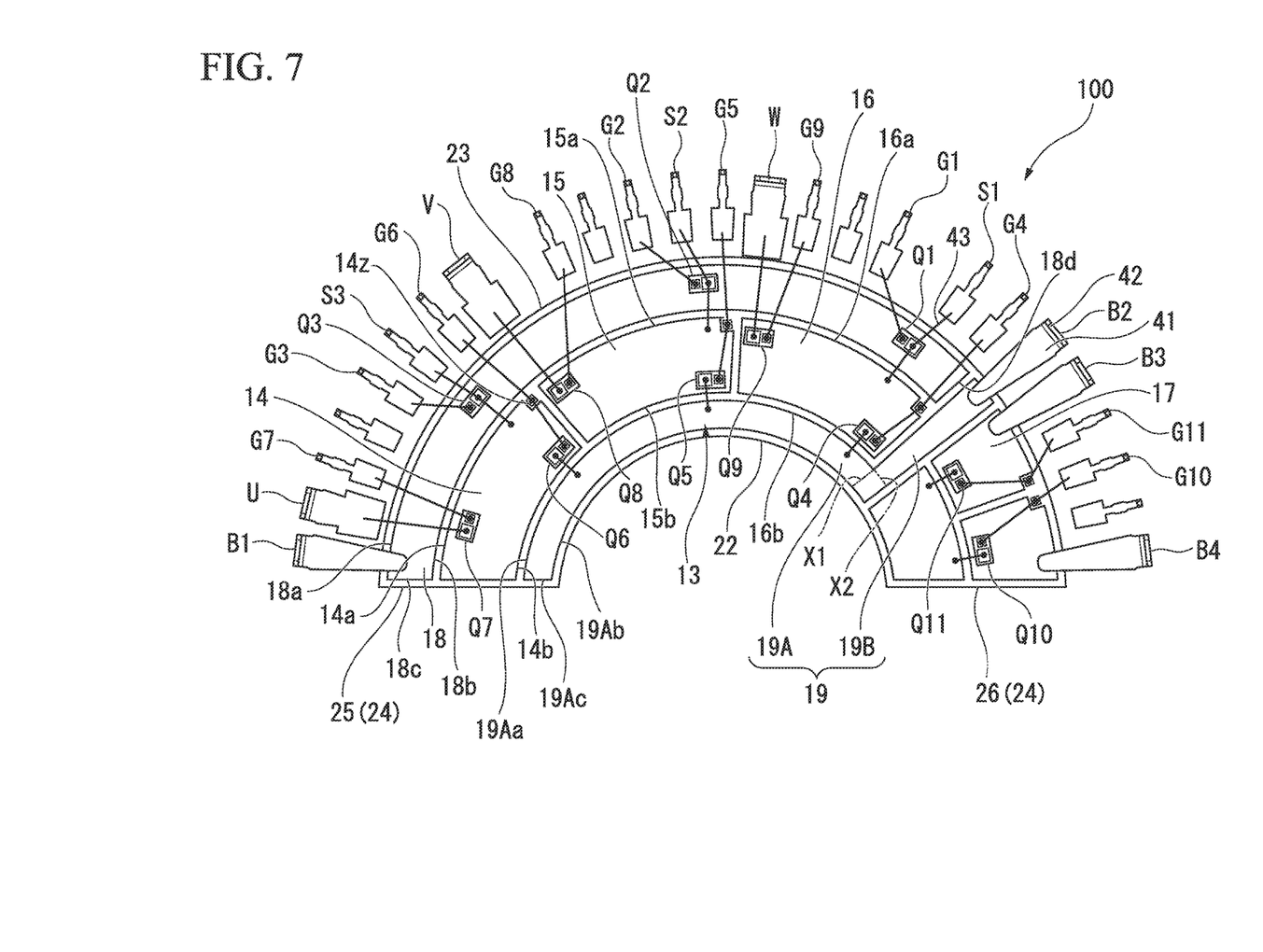
FIG. 7 is a view showing a circuit arrangement, on a substrate, of the semiconductor device.

The phase control circuit 13 shown in FIGS. 6 and 7 controls a plurality of phases of the motor 200. The phase control circuit 13 includes a first phase control circuit 14, a second phase control circuit 15, and a third phase control circuit 16. Each of the first phase control circuit 14, the second phase control circuit 15, and the third phase control circuit 16 controls an associated one of the plurality of phases of the motor 200. The first phase control circuit 14, the second phase control circuit 15, the third phase control circuit 16, and the relay circuit 17 are arranged on the single substrate 12, for example, in this order.

The first phase control circuit 14 controls a U-phase (first phase) of the motor 200. The first phase control circuit 14 includes switching units Q3, Q6, Q7 (see FIG. 8).

In plan view, a wiring pattern of the first phase control circuit 14 is concentric with the center of the partially-annular substrate 12 and is disposed in a partially-annular region that is smaller than the substrate 12 in both circumferential and radial directions.

As an example, an outer shape of the wiring pattern of the first phase control circuit 14 on the substrate 12 is, in plan view, a shape having an arcuate outer circumference 14a and an arcuate inner circumference 14b so as to be part, on the outer circumferential side, of a fan-shape that is concentric with the center of the partially-annular substrate 12 (hereinafter referred to as "partially-fan shape" in the present specification).

The wiring pattern of the first phase control circuit 14 includes a land 14z for relaying bonding wires 43 to the switching unit (e.g., the switching unit Q6 shown in FIG. 7) which constitutes the first phase control circuit 14.

Here, the outer shape of the wiring pattern of the first phase control circuit 14 is not limited to the above-described partially-fan shape.

For example, the outer shape of the wiring pattern of the first phase control circuit 14 may be a rectangular shape.

Additionally, as to the outer shape of the wiring pattern of the first phase control circuit 14, the outer circumference 14a and the inner circumference 14b in the circumferential direction of the substrate 12 may be equal in length to each other.

Further, the outer shape of the wiring pattern of the first phase control circuit 14 may be a shape defined by the above-described circular-arcuate inner circumference 14b, an outer circumference obtained by translating the inner circumference 14b radially outward from the substrate 12, and parallel circumferential ends linearly connecting the above outer circumference and the inner circumferential 14b.

As another outer shape of the wiring pattern of the first phase control circuit 14, a known shape may be selected as appropriate so long as the wiring pattern is provided between the power supply wiring 18 and ground wiring 19 and apart from both the power supply wiring 18 and the ground wiring 19.

The second phase control circuit 15 controls a V-phase (second phase) of the motor 200. The second phase control circuit 15 includes switching units Q2, Q5, Q8 (see FIG. 8).

In plan view, a wiring pattern of the second phase control circuit 15 is concentric with the center of the partially-annular substrate 12 and is arranged in a partially-annular region that is smaller than the substrate 12 in both the circumferential and radial directions.

As an example, an outer shape of the wiring pattern of the second phase control circuit 15 on the substrate 12 is, in plan view, a partially-fan shape having a circular-arcuate outer circumference 15a and a circular-arcuate inner circumference 15b, which are concentric with the center of the substrate 12.

Additionally, the outer shape of the wiring pattern of the second phase control circuit 15 may be the same as the outer shape of the wiring pattern of the first phase control circuit 14.

The third phase control circuit 16 controls a W-phase (third phase) of the motor 200. The third phase control circuit 16 includes switching units Q1, Q4, Q9 (see FIG. 8).

In plan view, a wiring pattern of the third phase control circuit 16 is concentric with the center of the partially-annular substrate 12 and is arranged in a partially-annular region that is smaller than the substrate 12 in both the circumferential and radial directions.

As an example, an outer shape of the wiring pattern of the third phase control circuit 16 on the substrate 12 is, in plan view, a partially-fan shape having a circular-arcuate outer circumference 16*a* and a circular-arcuate inner circumference 16*b*, which are concentric with the center of the substrate 12.

Additionally, the outer shape of the wiring pattern of the third phase control circuit 16 may be the same as the outer shape of the wiring pattern of the first phase control circuit 14.

The outer shape of the wiring pattern of the first phase control circuit 14, the outer shape of the wiring pattern of the second phase control circuit 15, and the outer shape of the wiring pattern of the third phase control circuit 16 may be congruent to one another in plan view.

Figure 8:
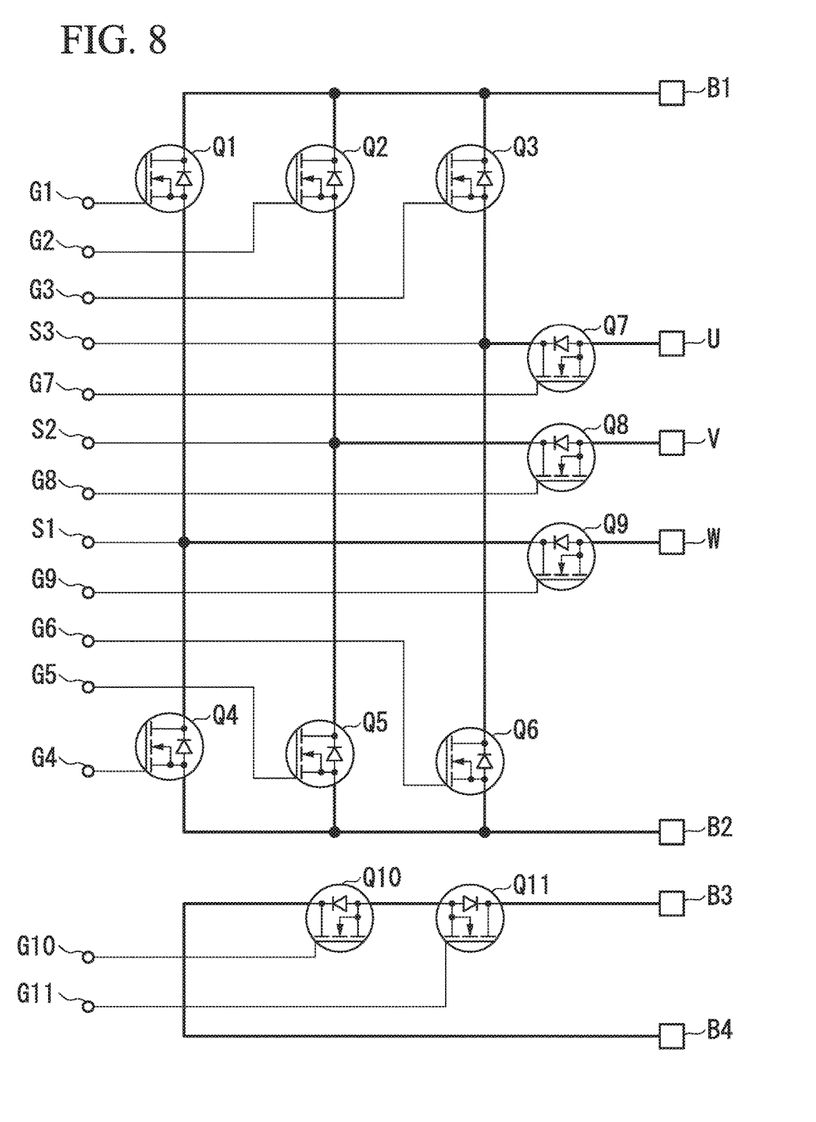
FIG. 8 is a circuit diagram of the semiconductor device.

The relay circuit 17 includes switching units Q10, Q11 (see FIG. 8).

The above-described switching units Q1 to Q11 are, for example, an n-channel MOSFETs as shown in FIG. 8. In the following description, one embodiment of the wirings and the circuit configuration on the substrate 12 is illustrated taking as an example a case where the switching units Q1 to Q11 are n-channel MOSFETs.

Each of the switching units Q1 to Q11 includes a drain electrode on a side in contact with the substrate 12, and source and gate electrodes on a side opposite to the drain electrode, in a thickness direction, of the substrate 12. Each of the switching units Q1 to Q11 is mounted on the substrate 12 by, for example, a bare chip bonding or the like.

The power supply wiring 18 is disposed on the outer circumferential side of the first phase control circuit 14, the second phase control circuit 15, and the third phase control circuit 16, in the radial direction of the substrate 12. The power supply wiring 18 extends along the circumferential direction of the substrate 12. The power supply wiring 18 is connected to one of the plurality of leads 40 that will be described later.

In plan view, of a contour line of the power supply wiring 18, a portion 18*b* extending in the circumferential direction, on the inner circumferential side, of the substrate 12 is shorter than a portion 18*a* extending in the circumferential direction, on the outer circumferential side, of the substrate 12.

Additionally, in plan view, the outer circumferential side portion 18*a* and the inner circumferential side portion 18*b* of the power supply wiring 18 are constituted of only curve. For example, in plan view, both the outer circumferential side portion 18*a* and the inner circumferential side portion 18*b* of the contour line of the power supply wiring 18 are circular arcuate. Further, the outer circumferential side portion 18*a* and the inner circumferential side portion 18*b* of the contour line of the power supply wiring 18 may be concentric or eccentric to each other.

Here, one or both of the outer circumferential side portion 18*a* and the inner circumferential side portion 18*b* of the power supply wiring 18 may include a straight line.

Additionally, in plan view, portions 18*c* and 18*d* of the contour line of the power supply wiring 18, which define both ends of the power supply wiring 18 in the circumferential direction of the substrate 12, are part of straight lines passing through the center of the partially annular substrate 12 and extending in the radial direction of the substrate 12.

Here, the shape, in plan view, of the power supply wiring 18 is not limited to the shape described above.

The ground winding 19 is disposed on the inner circumferential side of the first phase control circuit 14, the second phase control circuit 15, and the third phase control circuit 16, in the radial direction of the substrate 12. The ground wiring 19 extends along the circumferential direction of the substrate 12. The ground winding 19 is linearly pulled out in the radial direction of the substrate 12 from the inner circumference side of the substrate 12 to the outer circumferential side thereof, and is connected to one of the plurality of leads 40 that will be described later.

Specifically, the ground wiring 19 includes: a circumferentially extending portion 19A extending along the circumferential direction of the substrate 12; and a radially extending portion 19B extending from the inner circumferential side to the outer circumferential side of the substrate 12, along the radial direction of the substrate 12, from the end portion, in the circumferential direction, of the circumferentially extending portion 19A. The circumferentially extending portion 19A and the radially extending portion 19B are formed on the substrate 12 as a continuous conductor pattern on the substrate 12. A boundary between the circumferentially extending portion 19A and the radially extending portion 19B can be, for example, a virtual straight line extending in the radial direction of the substrate 12 as indicated by a reference numeral X1 shown in FIG. 7, or a virtual straight line extending in the circumferential direction of the substrate 12 as indicated by a reference numeral X2 shown in FIG. 7.

The circumferentially extending portion 19A is connected with source electrodes of the switching units Q4, Q5, Q6 via bonding wires or the like.

In FIG. 7, when the straight line indicated by the reference numeral X1 or X2 is considered to be the boundary between the circumferentially extending portion 19A and the radially extending portion 19B, in plan view, of the contour line of the circumferentially extending portion 19A, a portion 19Ab extending in the circumferential direction, on the inner circumferential side, of the substrate 12 is shorter than a portion 19Aa extending in the circumferential direction, on the outer circumferential side, of the substrate 12.

Additionally, in plan view, the outer circumferential side portion 19Aa and the inner circumferential side portion 19Ab of the circumferentially extending portion 19A are constituted of only curve. For example, both the outer circumferential side portion 19Aa and the inner circumferential side portion 19Ab of the contour line of the circumferentially extending portion 19A are circular-arcuate in plan view.

Here, one or both of the outer circumferential side portion 19Aa and the inner circumferential side portion 19Ab of the contour line of the circumferentially extending portion 19A may include a straight line.

Further, a portion 19Ac of the contour line of the circumferentially extending portion 19A, which defines an end portion positioned on the opposite side of the straight line X1 or X2, in the circumferential direction of the substrate 12, is linear in plan view.

Here, the shape of the circumferentially extending portion 19A is not limited to the above-described shape in plan view.

The radially extending portion 19B is disposed between the phase control circuit 13 and the relay circuit 17. In plan view, portions of the contour line of the radially extending portion 19B, which connect the inner and outer circumferential sides of the substrate 12 (portions which define both ends of the radially extending portion 19B in the circumferential direction of the substrate 12) may be straight lines parallel to each other, or part of two straight lines crossing each other at the center of the partially annular substrate 12.

Additionally, the line width of the radially extending portion 19B in the circumferential direction of the substrate 12 may be determined in consideration of reducing influence of noise emitted from the phase control circuit 13 and the relay circuit 17.

Here, the shape, in plan view, of the radially extending portion 19B is not limited to the shape described above.

In the present embodiment, the first phase control circuit 14, the second phase control circuit 15, and the third phase control circuit 16 are arranged between the power supply winding 18 and the ground winding 19. In other words, in the present embodiment, the phase control circuit 13 for controlling all the plurality of phases of the motor 200 to be controlled is disposed between the power supply wiring 18 and the ground winding 19.

As shown in FIGS. 4 to 6, the sealing resin 20 seals the substrate 12, the phase control circuit 13, and the relay circuit 17. The sealing resin 20 has a shape substantially similar to the substrate 12. The sealing resin 20 of the present embodiment is formed in, for example, a semicircular annular shape that is larger than the substrate 12.

The outer surface of the sealing resin 20 defines the outer contour of the device main body 10. In other words, the sealing resin 20 has an inner circumferential surface 27 and an outer circumferential surface 28 which are formed concentric and circular arcuate to each other in plan view. The inner circumferential surface 27 of the sealing resin 20 is an inner circumferential surface 29 of the device main body 10. The outer circumferential surface 28 of the sealing resin 20 is an outer circumferential surface 30 of the device main body 10.

The inner circumferential surface 27 of the sealing resin 20 (inner circumferential surface 29 of the device main body 10) surrounds the protruding portion 204 provided on the mounting surface 201 of the motor 200, in the state where the semiconductor device 100 has been mounted on the mounting surface 201 of the motor 200. As an example, the diameter dimension of the inner circumferential surface 27 of the sealing resin 20 (inner circumferential surface 29 of the device main body 10) is larger than the outer diameter dimension of the projecting portion 204.

Further, the sealing resin 20 has a cutout portion 31 to be locked with the screw 11 for screwing the device main body 10 of the semiconductor device 100 against the mounting surface 201. The cutout portion 31 is formed on the inner circumferential surface 29 of the device main body 10 that is the inner circumferential surface 27 of the sealing resin 20, and the outer circumferential surface 30 of the device main body 10 that is the outer circumferential surface 28 of the sealing resin 20. Therefore, as the screw 11 is locked into the cutout portion 31, the device main body 10 can stably be supported with respect to the mounting surface 201 (see FIGS. 1 and 2).

The leads 40 are made of a metal member with conductivity. In the present embodiment, the plurality of leads 40 are connected to the device main body 10. The plurality of leads 40 are arranged at intervals in the circumferential direction of the device main body 10. Each lead 40 has an inner lead portion 41 held by the sealing resin 20, and an outer lead portion 42 protruding from the sealing resin 20.

The inner lead portion 41 extends in the radial direction of the sealing resin 20, and is disposed on the outer circumferential portion 23 side of the substrate 12. The inner lead portion 41 is connected to the phase control circuit 13 on the substrate 12 by the wire bonding 43 (details thereof not shown) or the like.

The outer lead portion 42 is bent in the middle of its projecting direction and thereby has a portion radially extending outward continuously from the inner lead portion 41, and a portion extending in the thickness direction of the substrate 12. The portion of the outer lead portion 42 extending in the thickness direction of the substrate 12 extends away from the circuit board 21 side.

As shown in FIGS. 7 and 8, the plurality of leads 40 include leads G1 to G9 respectively connected to gate electrodes of the switching units Q1 to Q9. Further, the plurality of leads 40 include leads S1, S2, S3 to be connected to source electrodes of the switching units Q1, Q2, Q3.

The lead S1 is also connected to drain electrodes of the switching units Q4 and Q9 via the bonding wire 43 or the like.

The lead S2 is also connected to drain electrodes of the switching units Q5 and Q8 via the bonding wiring 43 or the like.

The lead S3 is also connected to drain electrodes of the switching units Q6 and Q7 via the bonding wiring 43 or the like.

Additionally, the plurality of leads 40 include: output leads U, V, W connected to the source electrodes of the switching units Q7, Q8, Q9; a lead B1 connected to the power supply winding 18; and a lead B2 connected to the ground winding 19. The leads B1 for power supply and leads B2 for grounding are both disposed on the outer circumferential side of the substrate 12.

Further, the plurality of leads 40 include: leads G10 and G11 connected to the switching units Q10 and Q11 of the relay circuit 17; leads B3 and B4 for power supply or grounding in the relay circuit 17.

Operation of the semiconductor device 100 of the present embodiment will be described.

Since the semiconductor device 100 of the present embodiment has the substrate 12 that is semicircular annular in plan view, the semiconductor device 100 is mountable on the mounting surface 201 that is circular annular or semicircular annular in plan view, in accordance with the shape, in plan view, of the mounting surface 201. For example, in the present embodiment, the semiconductor device 100 of the present embodiment fits within the half portion of the circular annular mounting surface 201. Further, in the present embodiment, the two semiconductor devices 100, 100 are arranged such that the first end portion 25 of the substrate 12 of one semiconductor device 100 faces the second end portion 26 of the substrate 12 of the other semiconductor device 100. Thus, it is possible to mount the two semiconductor devices 100, 100 to fit within the circular annular mounting surface 201. In this state, the two semiconductor devices 100, 100 become circular annular as a whole.

As described above, in the semiconductor device 100 of the present embodiment, the power supply winding 18 or the ground winding 19 is arranged on the inner circumferential side of the substrate 12. Thereby, the length of the wiring disposed on the inner circumferential side is shorter, thereby making it possible to reduce the inductance of the semiconductor device 100. As a result, an effect that the semiconductor device 100 of the present embodiment is less susceptible to the inductance caused by the supply current can be achieved. Since the semiconductor device 100 can be made less susceptible to the inductance caused by the power supply current, it is possible to increase the stability of the operation of each circuit in the semiconductor device 100.

Additionally, in the semiconductor device 100 of the present embodiment, it is possible to supply power from the power supply wiring 18 and the ground winding 19 provided on the same substrate 12 to the phase control circuit 13 (the first phase control circuit 14, the second phase control circuit 15, and the third phase control circuit 16). In other words, the phase control circuit 13 of the present embodiment is configured as a single module. Therefore, it is possible to reduce the number of power supply terminals (power supply leads B1, ground leads B2), as compared with a case where the first phase control circuit 14, the second phase control circuit 15, and the third phase control circuit 16 are configured as individual modules. Accordingly, it is possible to reduce the number of wiring steps included in the process of mounting the semiconductor device 100.

Further, since the three phases of the motor 200 can be controlled by a single module, it is also possible to reduce the number of steps in mounting the semiconductor device 100 onto the motor 200, as compared with the case of individually mounting the three modules for controlling the respective phases of the motor 200.

Moreover, a winding of the power supply winding 18 and the ground winding 19, which is disposed on the inner circumferential side of the substrate 12, is linearly pulled out from the inner circumferential side of the substrate 12 to the outer circumferential side thereof and is connected to the lead 40. Therefore, in the present embodiment, it is not necessary to provide the leads 40 for the inner circumferential portion 22 of the device main body 10, while it is possible to collectively arrange the leads 40 along the outer circumferential portion 23 of the device main body 10.

Additionally, since the radially extending portion 19B of the ground winding 19 extends from the circumferential end of the circumferentially extending portion 19A toward the outer circumferential side of the substrate, it is possible to sufficiently secure the length of the power supply wiring 18 extending in the circumferential direction of the substrate 12, which is disposed on the outer circumferential side of the substrate 12.

Further, in the present embodiment, the device main body 10 of the semiconductor device 100 is formed semicircular annular, while the two semiconductor devices 100 are circular annular so as to be mountable on the mounting surface 201 of the cylindrical motor 200. Therefore, in the state where the two semiconductor devices 100 have been mounted on the motor 200, it is possible to make simple cylindrical the shape of the entire module including the both. Accordingly, by adopting this configuration, it is possible to easily assemble the module at a predetermined portion of an apparatus using the motor 200.

Second Embodiment

A second embodiment of the present invention will be described.

Figure 9:
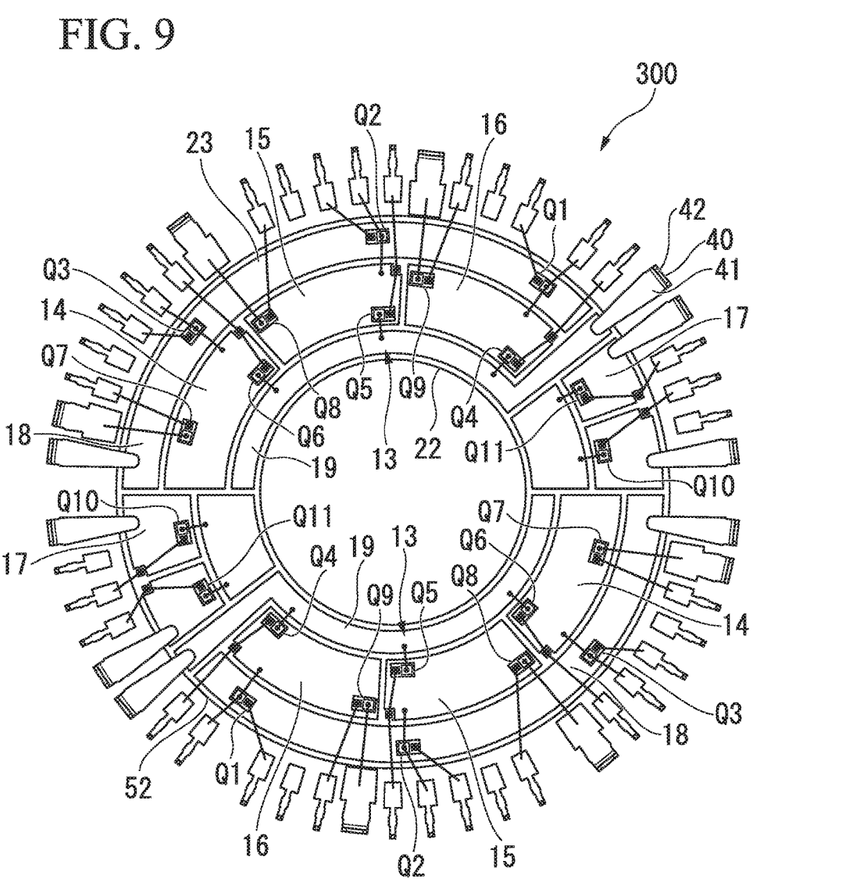
FIG. 9 is a plan view showing a substrate of a semiconductor device according to a second embodiment of the present invention.
Figure 10:
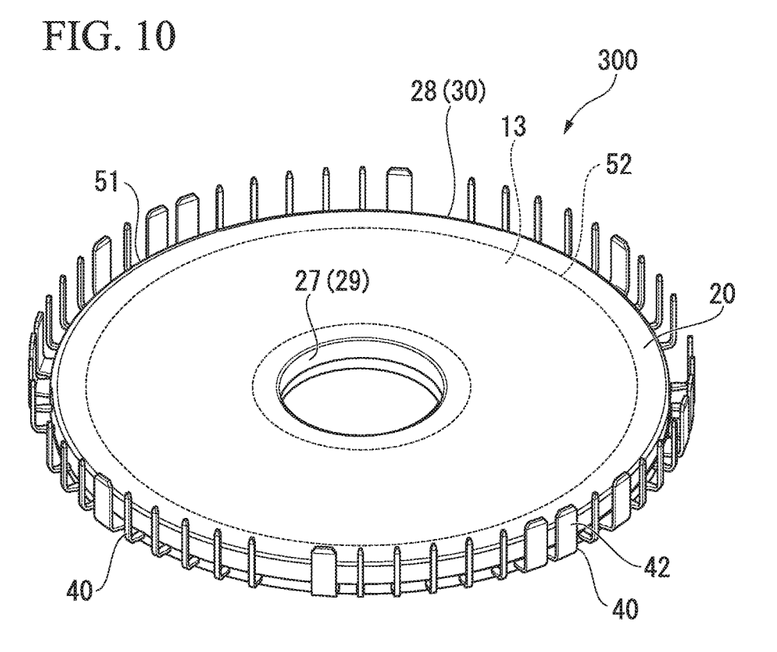
FIG. 10 is an external perspective view of a semiconductor device according to the same embodiment.

As shown in FIGS. 9 and 10, a semiconductor device 300 of the present embodiment is different from that of the first embodiment in that the semiconductor device 300 is continuously circular annular as a whole.

As shown in FIG. 9, the semiconductor device 300 includes a device main body 51 that is circular annular in plan view, and a plurality of leads 40 extending outward from an outer circumferential surface of the device main body 51 in the radial direction of the device main body 51.

Similarly to the first embodiment, the device main body 51 includes a substrate 52, a phase control circuit 13 provided on the substrate 52, and a sealing resin 20 sealing the substrate 52.

However, the substrate 52 of the present embodiment is formed circular annular in plan view. Additionally, the phase control circuit 13 provided on the substrate 52 includes, for example, two sets of the first phase control circuit 14, the second phase control circuit 15, and the third phase control circuit 16 are provided (see FIG. 9). Further, the phase control circuit 13 may include, for example, another circuit in addition to the first phase control circuit 14, the second phase control circuit 15, and the third phase control circuit 16.

For example, in a case where the phase control circuit 13 of the present embodiment includes two sets of the control circuits 14, 15, 16, the control circuits 14, 15, 16 are arranged so that one set is provided for each half of the substrate 52 (see FIG. 9). Further, in each set, the control circuits 14, 15, 16 are arranged in this order in the circumferential direction of the substrate 52. Additionally, for the control circuits 14, 15, 16 of each set, the power supply winding 18 and the ground winding 19 are arranged similarly to those of the first embodiment.

Similarly to the first embodiment, the leads 40 are connected to the phase control circuit 13 on the substrate 52 by the wire bonding 43 or the like.

Similarly to the first embodiment, the semiconductor device 300 of the present embodiments are suitably mountable on the mounting surface 201 that is circular annular in plan view.

Additionally, also in the semiconductor device 300 of the present embodiment, a wiring of the power supply wiring 18 and the ground winding 19, which is disposed on the inner circumferential side of the substrate 52, can be shortened, thereby making it possible to reduce the inductance of the semiconductor device 300. As a result, the semiconductor device 300 of the present embodiment is less susceptible to the inductance caused by the power supply current.

Although the embodiments of the present invention have been described in detail with reference to the drawings, specific configurations are not limited to those embodiments, design modifications made without departing from the scope of the present invention are also included.

For example, all the phase control circuits of the semiconductor device need not be disposed between the power supply winding and the ground winding, as long as at least two phase control circuits are disposed therebetween. In this case, the remaining phase control circuit may be disposed, for example, at any position between the power supply wiring and the ground wiring.

Additionally, although the examples that the shapes of the substrate and the device main body are semicircular annular or circular annular are shown in the above embodiments, the substrate and the device main body may be partially circular annular.

Further, the shape of the sealing resin may be circular annular or partially circular annular, not similar to the shape of the substrate.

Moreover, the mounting surface of the apparatus such as a motor to be mounted with the semiconductor device is not limited to a circular annular shape, but may be a partially circular annular shape.

Additionally, in each of the above embodiments, although the outer circumferential surface and the inner circumferential surface of the device main body of the semiconductor device is formed circular arcuate, either one or both of the outer circumferential surface and the inner circumferential surface of the device main body may be a polygonal shape or an elliptical shape.

For example, the shape, in plan view, of the device main body may be any one of an elliptical annular shape, a polygonal annular shape, an annular shape with a radial width that is non-uniform in the circumferential direction. For example, in a case where an outer shape of the motor to be mounted with the semiconductor device is a polygonal outer shape, the shape of the outer circumferential surface of the device main body may be an annular or partially annular shape having a polygonal outer circumferential surface corresponding to the outer shape of the motor. In this case, a shape, in plan view, of the inner circumferential surface of the device main body may be, for example, polygonal, circular, elliptic, or the like.

If the device main body has an outer shape other than a circular annular shape or semicircular annular shape, the description in the above embodiments and the above modified examples may be read by replacing the axial direction, the circumferential direction, and the radial direction with the directions relating to the entire outer shape or part of an approximate circle (circular arc), and its central axis.

The partially annular shape is not particularly limited as long as an inner circumferential surface of the device main body is formed in a groove shape. Therefore, even a center angle representing a range of the inner circumferential surface with respect to the center of the partially annular shape is not particularly limited. For example, the central angle is not limited to 180° as of the semicircular annular shape, may be smaller or larger than 180°.

Additionally, the inner circumferential surface and the outer circumferential surface of the device main body may be, for example, eccentric to each other. In a case where the device main body is partially annular, and the inner circumferential surface and the outer circumferential surface are eccentric to each other, by using two semiconductor devices having shapes that are mutually plane-symmetric in plan view, the two semiconductor devices can be mounted on an apparatus so as to form an annular shape as a whole.

Further, regarding the substrate, similarly to the device main body, the inner circumferential portion and the outer circumferential portion may be, for example, eccentric to each other.

Further, when an object to be controlled by the semiconductor device of the present embodiment is, for example, a single-phase motor, three control circuits may not always be on the substrate according to the controlled object.

Moreover, the power supply wiring 18 may be disposed on the inner circumferential side of the substrate 12, while the ground wiring 19 may be disposed on the outer circumferential side of the substrate. In this case, in a state where two semiconductor devices 100, 100 are mounted on the motor 200 so as to form a circular annular shape, the ground wiring 19 protects the phase control circuit 13 from noise or the like. As a result, the operation of the phase control circuit 13 can be stabilized. Additionally, in a case where the ground winding 19 is disposed on the outer circumferential side of the substrate 12, it is possible to reduce interference of the noise emitted by the phase control circuit 13 with other apparatuses outside the semiconductor device 100.

Although the example where the outer lead portions extend in the thickness direction of the substrate away from the circuit board side is shown in the above embodiments, for example, some or all of the plurality of outer lead portions may extend in the thickness direction of the substrate toward the circuit board side. In such a configuration, for example, in a case where a socket is provided on the mounting surface of the apparatus, in the step of mounting the semiconductor device onto the mounting surface, the outer leads extending toward the circuit board side can be inserted directly into the socket to electrically connect the semiconductor device and the apparatus.

Here, design modifications to the above specific configuration are not limited to the above-described matters.

DESCRIPTION OF REFERENCE NUMERALS

100, 300: semiconductor device
10, 51: device main body
11: screw
12, 52: substrate
13: phase control circuit
14: first phase control circuit
15: second phase control circuit
16: third phase control circuit
17: relay circuit
18: power supply wiring
19: ground wiring
20: sealing resin
21 circuit board
22: inner circumferential portion
23: outer circumferential portion
24: end portion
25: first end portion
26: second end portion
27: inner circumferential surface
28: outer peripheral surface
29: inner circumferential surface
30: outer circumferential surface
31: cutout portion
40: lead
41: inner lead portion
42: outer lead portion
43: wire bonding
200: motor
201: mounting surface
202: case
203: one surface
204: protruding portion
205: screw hole
206: outer circumferential surface

The invention claimed is:
1. A semiconductor device comprising:
a substrate that is annular or partially annular, the substrate having an inner circumferential portion arcuate in plan view and an outer circumferential portion arcuate in plan view;
a first phase control circuit on the substrate, the first phase control circuit being configured to control a first phase of a plurality of phases of a motor;
a second phase control circuit on the substrate so as to be adjacent to the first phase control circuit in a circumferential direction of the substrate, the second phase control circuit being configured to control a second phase of the plurality of phases of the motor, the second phase being different from the first phase;

a power supply wiring on one of an outer circumferential side and an inner circumferential side of the first phase control circuit and the second phase control circuit in a radial direction of the substrate, the power supply wiring being connected to the first phase control circuit and the second phase control circuit, and the power supply wiring extending in the circumferential direction of the substrate; and a ground wiring on an other one of the outer circumferential side and the inner circumferential side of the first phase control circuit and the second phase control circuit in the radial direction of the substrate, the ground wiring being connected to the first phase control circuit and the second phase control circuit, and the ground wiring extending in the circumferential direction of the substrate, wherein the substrate is attachable onto, and detachable from, the motor, the substrate having a first region on the inner circumferential portion side, a second region on the outer circumferential portion side, and a third region between the first region and the second region, the first region being annular or partially annular, the second region being annular or partially annular, and the third region being annular or partially annular, one of the power supply wiring and the ground wiring is on the first region, an other one of the power supply wiring and the ground wiring is on the second region, and the first region, the second region, and the third region are on a single flat surface of the substrate.

2. The semiconductor device according to claim 1, wherein the substrate is semicircular annular in plan view.

3. The semiconductor device according to claim 1, further comprising:

a third phase control circuit configured to control a third phase of the plurality of phases of the motor, the third phase being different from the first phase and the second phase, wherein the third phase control circuit is on the third region.

4. The semiconductor device according to claim 3, wherein the first phase control circuit, the second phase control circuit, and the third phase control circuit are configured as a single module.

5. The semiconductor device according to claim 1, wherein the power supply wiring is on the first region, and the ground wiring is on the second region.

6. The semiconductor device according to claim 1, wherein the power supply wiring is on the second region, the ground wiring is on the second region, and the ground wiring has a radially extending portion extending linearly from the first region side to the second side and is connected to a lead on the second region side.

7. The semiconductor device according to claim 1, further comprising:

a plurality of leads connected to the outer circumferential portion of the substrate, each of the plurality of leads has a first portion extending outward from the outer circumferential portion of the substrate in the radial direction of the substrate, and a second portion extending from the first portion in a thickness direction of the substrate.

\* \* \* \* \*